United States Patent Office 3,168,404
Patented Feb. 2, 1965

3,168,404
TREATMENT OF SURFACE OF PHOTOPOLYMERIZABLE ELEMENTS FOR IMAGE FORMATION

William Jeremiah McGraw, Radnor, Pa., assignor to E. I. du Pont de Nemours and Company, Wilmington, Del., a corporation of Delaware No Drawing. Filed Aug. 21, 1962, Ser. No. 218,455
5 Claims. (Cl. 96—115)

This invention relates to photopolymerizable elements and more particularly to such elements which are suitable for the preparation of letterpress printing reliefs. Still more particularly, it relates to a process of treating photopolymerizable elements which are useful for the preparation of line and halftone printing reliefs. The invention also relates to a photopolymerization process utilizing the treated elements.

Photopolymerizable elements useful for the preparation of printing reliefs are disclosed in Plambeck U.S. Patent No. 2,760,863, granted Aug. 28, 1956, and certain of these elements are claimed in Plambeck U.S. Patent No. 2,791,504, granted May 7, 1957. In these patents it is disclosed that inhibitors of thermal addition polymerization may be present. These inhibitors, e.g., hydroquinone and tertiary butyl catechol, are uniformly distributed through the layer and tend to reduce unwanted addition polymerization in non-exposed or non-image areas. The printing characters formed in accordance with the teachings of the Plambeck patents having sloping sides when seen in cross-section, the angle formed with the base being at the minimum of about 50°. These character shapes are advantageous, but in the case of halftones, the well between the dots sometimes is very shallow as a result of the intersection of the sloping sides of contiguous dots with one another. This is particularly true when the plate has been exposed sufficiently to insure that the halftone highlight dots and fine lines have strong bases and are firmly anchored to the support so that they are not lost in processing and plate wear. Consequently, during printing with reliefs of this type, the wells tend to plug up with ink. Particularly in the more shaded areas of the halftones and/or reverses where the wells are smaller in diameter and more likely to be shallow and easily plugged, this difficulty is more noticeable. Furthermore, although the problem exists in printing on all kinds of paper such as that used for greeting cards and for magazines having smooth-surfaced sheets, it is particularly troublesome in printing on softer papers, such as newsprint, where plugging is more apt to occur. Also, the present photopolymerizable elements are limited to providing halftone highlight dots no smaller than 5% in value. Highlight halftone dots smaller than 5% which would not be easily lost are much to be desired.

According to the above-cited Plambeck patents, the degree of taper of the printing character is obtained by optical means, i.e., by careful choice of the light source and distance from the plate to source and by use of suitable baffles. However, such exact control is difficult to achieve and has required close attention by the technician. In Crawford U.S. Patent 2,993,789, granted July 25, 1961, it is proposed to overcome the above-mentioned difficulties by varying the amount of inhibitor throughout the thickness of the photopolymerizable layer, that is, having at least 1.5 times the amount of inhibitor in the upper stratum as there is in the lower stratum.

The elements of the above-cited Plambeck patents also contain an addition polymerization initiator which is uniformly disposed throughout the entire thickness of the photopolymerizable layer. In the case of layers more than 30 mils in thickness, there is a tendency for highlight halftone dots to be incompletely converted to the insoluble state at the base at exposure levels correct for the shadow areas. If the exposure is continued until the highlight dots are insolublized at the lower level of the layer, the shadow areas become plugged as described above, and the recesses in characters, for example, the center of an "o" or an "e," may be filled, with the result that the relief has insufficient depth for a clear, sharp print. Similarly, in reverse areas, i.e., where no printing is to take place, a certain amount of inking will take place resulting in poor copy. In an attempt to solve this problem, Plambeck U.S. Patent 2,964,401 suggests a differential gradient in the amount of the addition polymerization initiator activatable by actinic light throughout the thickness of the photosensitive layer. In these strata, the concentration of initiator increases in accordance with increases in the depth of the layer.

By having a large amount of inhibitor in the upper strata of the photopolymerizable element, the upper portions of the printing characters produced therefrom have sides which in cross-section at the duration of exposure are nearly vertical and at the same time have a broad slanting base. Thus, a relief of great strength is obtained in which the printing characters, having broad bases are firmly anchored to the support. The upper portions, having nearly vertical sides, provide very sharp printing edges and avoid the formation of shallow wells between the characters and in reverse areas. Furthermore, because the walls of the upper portions are essentially vertical there is practically no broadening of the characters of the printed impression as the plate wears down with use. In stratified plates in which the upper stratum contain an increased amount of inhibitor and the lower stratum contains increased amounts of initiator, an especially advantageous character-shape is obtained. The cross-section shows an upper portion where the angle at which the side walls approach the surface of the support is about 90° and the base which is not only broader than the top but is also buttressed between the support and the point of juncture between the upper and lower strata.

Although the processes taught by the above-cited Plambeck and Crawford patents afford an improved means of controlling the shape of the printing characters, the processes of manufacturing them are quite complicated, requiring several coating or laminating steps which make their preparation uneconomical. While the above prior processes afford a means of controlling the shape of the printing character in depth, they do not provide adequate control for the depth of the shadow wells and reverse areas.

An object of this invention is to provide new and improved photopolymerizable elements. Another object is to provide such elements which result in sharp, clean reliefs in finely detailed areas, halftones and fine lines. A further object is to provide such elements which are useful in making line and halftone reliefs simultaneously from a process negative containing line and halftone images, especially in relief heights greater than 30 mils. Yet another object is to provide a process for treating photopolymerizable elements whereby the shape of the base of the relief and the diameter of the halftone dot and size of fine line characters can be more easily controlled. A further object is to provide a process for controlling the size of relief characters in photopolymerizable elements which can be easily carried out by the ordinary technician. A still further object is to provide a process of treating photopolymerizable elements whereby there is provided in the exposed and processed element strong highlight dots of reduced diameter, e.g., of the order of 1–2% in value, shadow wells of increased depth and deeper reverse areas. Still other objects will be apparent from the following description of the invention.

The above objects are attained in accordance with the invention which in one aspect comprises treating with an oxidizing agent the photopolymerizable surface of a photopolymerizable element having a support, e.g., a metal or polymeric sheet or plate and a solid photosensitive layer 5 to 250 mils or more in thickness comprising (1) At least one addition polymerizable non-gaseous ethylenically unsaturated compound capable of forming a high polymer by photoinitiated polymerization in the presence of an addition polymerization initiator activatable by actinic radiation, (2) At least one preformed compatible solid macromolecular polymer, and preferably, (3) A free-radical generating addition polymerization initiator activatable by actinic radiation in an amount from 0.001 to 35% by weight of such initiator based on the weight of the unsaturated compound, but not exceeding the solubility of the initiator in the composition and, if desired, (4) A thermal addition polymerization inhibitor in an amount from 30 to 150,000 parts of said inhibitor per million parts by weight of said unsaturated compound, constituents (3) and (4) being uniformly distributed through the photosensitive layer. In general, there are about 10 to 60 parts by weight of constituent (1) and 40 to 90 parts by weight of constituent (2) present in the photosensitive layer.

To be more specific, the process of the invention comprises treating the surface of the above-described photosensitive element before exposure to actinic radiation with an aqueous solution of a strong oxidizing compound, e.g., hydrogen peroxide, sodium hypochlorite, sodium perborate tetrahydrate, urea peroxide, potassium peroxymonosulfate, potassium permanganate, calcium peroxide and zinc peroxide. These oxidizing compounds provide free oxygen. The surface may be treated by coating, impregnating, dipping, spraying or swabbing techniques.

The ethylenically unsaturated compound (1) which is capable of polymerizing or forming a high polymer in a short period of time by photoinitiated chain-propagating addition polymerization can be any of the monomeric compounds disclosed in Plambeck U.S. Patent 2,760,863. Preferably the compounds are non-gaseous addition-polymerizable ethylenically unsaturated compounds having 1 to 4 or more terminal ethylenic groups, preferably two or more. The preformed compatible solid macromolecular polymer (2) may be a condensation or addition polymer, e.g., cellulose ether or ester capable of forming hard, coherent films. Suitable cellulosic polymers are those made with a dicarboxylic acid such as cellulose acetate succinate and those made with maleic and glutaric acids as well as the esters of aromatic dicarboxylic acids, e.g., of phthalic acid, tetrahydrophthalic acid, etc. Polyvinyl alcohol derivatives such as polyester, polyacetal or mixed polyesteracetal such as those disclosed in Martin U.S. Patent 2,892,716 may also be used.

The free-radical generating addition polymerization initiator is preferably one which is activatable by actinic light and thermally inactive at and below 185° C. and includes the substituted or unsubstituted polynuclear quinones which are compounds having two intracyclic carbonyl groups attached to intracyclic carbon atoms in a conjugated carbocyclic ring system, e.g., anthraquinones, etc. Certain aromatic ketones, e.g., benzophenone, are also useful, some of which may be thermally active at temperatures as low as 85° C.

Useful thermal polymerization inhibitors (4) which may be present include p-methoxyphenol, hydroquinone, alkyl- and hydroxyl-substituted hydroquinones and quinones, tertiary butyl catechol and pyrogallol.

The support may be any suitable base including metal supports, e.g., steel and aluminum plates, sheets and foils, and films or plates composed of various film-forming synthetic resins or high polymers, such as addition polymers, e.g., vinylidene polymers, vinyl polymers, copolymers of vinyl compounds, and condensation polymers such as polyesters, e.g., polyethylene terephthalate; the polyamides, e.g., polyhexamethylene sebacamide; polyesteramide, e.g., polyhexamethyleneadipamide/adipate, etc. Fillers or reinforcing agents can be present in the synthetic resin or polymer bases such as the various fibers (synthetic, modified or natural), e.g., cellulose fibers, for instance, cotton, cellulose acetate, viscose, rayon, paper, glass wool and nylon. These reinforced bases may also be used in laminated form.

The invention will be further illustrated but is not intended to be limited by the following examples.

*Example I*

A photopolymerizable composition comprising 30 parts of triethylene glycol diacrylate, 67 parts of cellulose acetate succinate with a degree of acetyl substitution of 1.9 and succinyl substitution of 0.7, 0.13 part of 2-ethylanthraquinone and 0.13 part of p-methoxyphenol was prepared according to assignee's Smith U.S. Patent 3,012,-952. This composition was pressed into a sheet of about 40 mils in thickness and bonded to adhesive coated aluminum plates, about 100 mils thick, according to assignee's Burg U.S. Patent 3,036,913. Two of the resulting photopolymerizable plates were conditioned in an inert atmosphere as disclosed in assignee's Canadian Patent No. 642,815. One plate was used as a control and was not given any further treatment. The second plate was swabbed with cotton wet with 3% hydrogen peroxide solution. The surface was wiped clean with dry cotton. A standard process negative bearing a halftone screen image containing halftone shadow dots having a diameter of 6.2 mils and highlight dots 1.8 mils in diameter was placed on the surface of the control plate and the hydrogen peroxide treated plate and the assemblies were exposed in a vacuum frame for two minutes, respectively, to radiation from a 140-ampere carbon arc lamp spaced about 30 inches from the negative. The surfaces of the exposed elements were then subjected for about 10 minutes to a spray of 0.04 molar solution of sodium hydroxide. After drying, the processed plates were measured to give the following data on the relief-image characteristics in the shadow areas:

| | Negative, mils | Untreated Plate, mils | Peroxide Treated, mils |
|---|---|---|---|
| Well diameter | 6.2 | 6.2 | 7.6 |
| Well depth | ------------ | 2.0 | 3.0 |

In the highlight areas the dot diameters were measured at the same density step to give the following data:

| | Dot diameter in mils |
|---|---|
| Negative (hole diameter) | 1.8 |
| Untreated plate | 1.4 |
| Peroxide treated plate | 1.0 |

It will be readily appreciated from the above data that the shadow well depth had increased and that the highlight dot size had decreased.

*Example II*

A series of four photopolymerizable printing plate elements were coated as described in Example I and treated before exposure as follows:

(1) Control—no treatment before exposure
(2) Sprayed with fine mist of 3% aqueous hydrogen peroxide and dried
(3) Sprayed with a fine mist of a solution made up of 7 grams of potassium permanganate in 93 grams of 0.038 N sodium hydroxide
(4) Sprayed with a fine mist of a 5.25% sodium hypochlorite The plates were then exposed to actinic radiation, as described in Example I, through a negative containing a reverse area period (.) having a diameter of 7.3 mils and an open area equivalent to a highlight halftone dot of 1.7 mils for time periods of 2, 3, 4 and 5 minutes. After the plates were processed by spray-washing as described in Example I, measurements of relief characters gave the following results.

| | | Exposure Time, Minutes | | | |
|---|---|---|---|---|---|
| | | 2′ | 3′ | 4′ | 5′ |
| (1) | Well Depth of (.) in mils | 1.36 | 1.21 | 1.08 | 1.12 |
| | Well Diameter of (.) in mils | 7.2 | 7.2 | 7.2 | 7.2 |
| | Highlght Halftone Dot Diameter in mils | 1.2 | 1.2 | 1.2 | 1.4 |
| (2) | Well Depth of (.) in mils | 1.64 | 1.92 | 1.84 | 2.00 |
| | Well Diameter of (.) in mils | 7.6 | 8.0 | 8.0 | 8.00 |
| | Hightligh Halftone Dot Diameter in mils | 0.7 | 0.7 | 0.7 | 0.7 |
| (3) | Well Depth of (.) in mils | 1.52 | 1.14 | 1.28 | 1.60 |
| | Well Diameter of (.) in mils | 7.6 | 7.6 | 7.2 | 7.2 |
| | Highlight Halftone Dot Diameter in mils | 1.0 | 1.0 | 1.2 | 1.2 |
| (4) | Well Depth of (.) in mils | 1.76 | 1.76 | 2.08 | 1.32 |
| | Well Diameter of (.) in mils | 7.6 | 7.6 | 7.5 | 7.5 |
| | Highlight Halftone Dot Diameter in mils | 0.7 | 1.0 | 1.2 | 1.2 |

From the foregoing data, hydrogen peroxide appears to be the most efficacious oxidizing agent. The other oxidizing agents were effective in various degrees in controlling the size and depth of the printing characters.

*Example III*

A series of four photopolymerizable printing plate elements were coated and conditioned in an inert atmosphere as described in Example I and treated before exposure as follows:

(1) Control—sprayed with a fine mist of distilled water
(2) Sprayed with a fine mist of a 10% solution of sodium borate perhydrate
(3) Sprayed with a fine mist of a solution of 20 grams of zinc peroxide dissolved in 40 grams of concentrated hydrochloric acid and 40 grams of water
(4) Sprayed with a fine mist of a solution of 20 grams of sodium perborate tetrahydrate in 80 grams of water The four plates were then, respectively, exposed and processed as described in Example II and measurements of the relief characteristics gave the results shown in the following table wherein (*a*) indicates well depth in mils of (.), (*b*) indicates well diameter of the period (.) in mils, and (*c*) indicates highlight halftone dot diameter in mils.

| | | Exposure Time in Minutes | | | |
|---|---|---|---|---|---|
| | | 2 | 3 | 4 | 5 |
| 1) | *a* | 1.40 | 1.12 | 1.20 | 1.12 |
| | *b* | 7.2 | 7.2 | 7.2 | 7.2 |
| | *c* | 1.4 | 1.4 | 1.4 | 1.4 |
| (2) | *a* | 2.52 | 2.52 | 2.52 | 2.40 |
| | *b* | 7.6 | 7.6 | 7.6 | 7.6 |
| | *c* | 0.6 | 0.5 | 0.7 | 0.9 |
| (3) | *a* | 2.00 | 2.36 | 2.40 | 2.92 |
| | *b* | 8.0 | 9.1 | 9.3 | 8.4 |
| | *c* | 0 | 0 | 0 | 0 |
| (4) | *a* | 2.08 | 2.04 | 2.32 | 2.20 |
| | *b* | 8.0 | 8.3 | 8.0 | 8.3 |
| | *c* | 0 | 0 | 0.3 | 0.6 |

*Example IV*

A series of six photopolymerizable printing plate elements were coated and conditioned in an inert atmosphere as described in Example I and treated before exposure as follows:

(1) Control—sprayed with a fine mist of distilled water.
(2) Sprayed with a fine mist of 8.8% aqueous solution of urea peroxide.
(3) Sprayed with a fine mist of 4.4% aqueous solution of urea peroxide.

(4) Sprayed with a fine mist of a 2.2% aqueous solution of urea peroxide.
(5) Sprayed with a fine mist of a 1.1% aqueous solution of urea peroxide.
(6) Sprayed with a fine mist of a 0.55% aqueous solution of urea peroxide.

The six plates were then exposed and processed as described in Example II and measurements of the relief chararacteristics gave the results set forth in the following table wherein (*a*), (*b*) and (*c*) have the same meaning as in Example III:

| | | Exposure Time in Minutes | | | |
|---|---|---|---|---|---|
| | | 2 | 3 | 4 | 5 |
| (1) | *a* | 1.40 | 1.12 | 1.20 | 1.12 |
| | *b* | 7.2 | 7.2 | 7.2 | 7.2 |
| | *c* | 1.4 | 1.4 | 1.4 | 1.4 |
| (2) | *a* | 2.44 | 2.84 | 3.04 | 2.82 |
| | *b* | 8.0 | 8.4 | 8.3 | 8.2 |
| | *c* | 0.3 | 0.7 | 0.8 | 0.8 |
| (3) | *a* | 2.64 | 2.40 | 2.76 | 2.20 |
| | *b* | 8.3 | 8.3 | 8.2 | 8.2 |
| | *c* | 0.3 | 0.7 | 0.8 | 1.0 |
| (4) | *a* | 1.72 | 1.80 | 1.40 | 1.48 |
| | *b* | 7.6 | 7.6 | 7.6 | 7.6 |
| | *c* | 1.0 | 1.0 | 1.0 | 1.2 |
| (5) | *a* | 1.96 | 1.88 | 1.80 | 2.04 |
| | *b* | 7.6 | 7.6 | 7.6 | 7.6 |
| | *c* | 1.0 | 0.8 | 1.0 | 1.0 |
| (6) | *a* | 1.0 | 1.36 | 1.04 | 1.90 |
| | *b* | 7.2 | 7.2 | 7.2 | 7.2 |
| | *c* | 1.3 | 1.2 | 1.4 | 1.2 |

It will be seen from the foregoing table that urea peroxide is quite effective, particularly in the higher concentrations.

In all cases where shadow and reverse wells become deeper and larger in diameter and the highlight halftone dots become smaller, the resulting printing plates produced highly improved printed impressions over those obtained from untreated plates.

This invention, obviously, is not limited to the treatment with aqueous oxidizing solutions, photopolymerizable layers and elements described in the above-cited Plambeck and Crawford patents. To the contrary, beneficial results can be obtained by similar treatment of the elements described in the following U.S. patents: Munger 2,923,673, Feb. 2, 1960; Martin and Barney, 2,927,022, Mar. 1, 1960; Notley, 2,951,758, Sept. 6, 1960; Smith, 3,012,952, Dec. 12, 1961; Jennings, 3,036,914, May 29, 1962; Notley, 3,036,915, May 29, 1962; and Barney, Engelhardt and Plambeck, 3,046,127, Sept. 4, 1962.

The photopolymerizable elements treated in accordance with the process of this invention can be used in all classes of printing including lithography but are most applicable to those classes of printing wherein a distinct difference of height between printing and non-printing surfaces is required. These classes include those wherein the ink is carried by the raised portion of the relief such as in dry offset printing and ordinary letterpress printing, the latter requiring greater height differences between printing and non-printing areas, and those wherein ink is carried by the recessed portions of the relief such as intaglio printing, e.g., line and inverted halftone. The so-treated plates are also useful for multicolor printing.

An advantage of this invention is that it provides photopolymerizable elements which can be readily photoploymerized to form high quality images of sufficient thickness to eliminate routing when the process negative contains very small and very large clear areas. It provides photopolymerizable elements which are useful for forming in a single printing plate an image which more faithfully reproduces line and very fine highlight halftone images and at the same time deep shadow halftone and reverse images from a single exposure through a negative containing such images. Another further advantage is that the process of treating the photopolymerizable elements according to the invention increases the exposure latitude. A further advantage of the invention is that halftone areas can be overexposed to strengthen the relief characters without causing halftone shadow wells to become so shallow that ink plugging results during printing.

A still further advantage of the invention is that it provides a simple and dependable means for controlling the shape of the printing character. The production of the desired printing character form takes place automatically and therefore eliminates tedious control of exposure by the technician. A still further advantage is that the invention affords a method of producing strong highlight halftone dots of the order of 1–2% in value as compared to 5% in value which is about the minimum which can be obtained by the prior art methods.

I claim:

1. A process for improving photopolymerizable plates for subsequent, imagewise, photopolymerization which comprises applying to the surface of a photopolymerizable layer of a photopolymerizable element an aqueous solution containing a strong oxidizing agent selected from the group consisting of hydrogen peroxide, sodium hypochlorite, sodium perborate, urea peroxide, potassium peroxymonosulfate, potassium permanganate, calcium peroxide and zinc peroxide; said layer being solid, 5 to 250 mils in thickness and comprising:

(1) at least one addition polymerizable non-gaseous ethylenically unsaturated compound capable of forming a high polymer by photoinitiated polymerization in the presence of an addition polymerization initiator activatable by actinic radiation, and (2) at least one preformed compatible solid macromolecular polymer.

2. A process according to claim 1 wherein 10–60 parts of constituent (1) and 40–90 parts of constituent (2), by weight, are present in the photopolymerizable layer.

3. A process for improving photopolymerizable plates for subsequent, imagewise, photopolymerization which comprises applying to the surface of a photopolymerizable layer of a photopolymerizable element an aqueous solution containing hydrogen peroxide, said layer being solid, 5 to 250 mils in thickness and comprising:

(1) at least one addition polymerizable non-gaseous ethylenically unsaturated compound capable of forming a high polymer by photoinitiated polymerization in the presence of an addition polymerization initiator activatable by actinic radiation, and (2) at least one preformed compatible solid macromolecular polymer.

4. A process for improving photopolymerizable plates for subsequent, imagewise, photopolymerization which comprises applying to the surface of a photopolymerizable layer of a photopolymerizable element an aqueous solution containing a strong oxidizing agent selected from the group consisting of hydrogen, peroxide, sodium hypochlorite, sodium perborate, urea peroxide, potassium peroxymonosulfate, potassium permanganate, calcium peroxide and zinc peroxide; said layer being solid, 5 to 250 mils in thickness and comprising:

(1) at least one addition polymerizable non-gaseous ethylenically unsaturated compound capable of forming a high polymer by photoinitiated polymerization in the presence of an addition polymerization initiator activatable by actinic radiation, (2) at least one preformed compatible solid macromolecular polymer, (3) a free-radical generating addition polymerization initator activatable by actinic radiation in an amount from 0.001% to 35% by weight of such initiator based on the weight of the unsaturated compound and, if desired, (4) a thermal addition polymerization inhibitor in an amount from 30 to 150,000 parts per million parts by weight of the unsaturated compound, said constituents (3) and (4) being uniformly distributed throughout the sensitive layer.

5. A process according to claim 3 wherein 10–60 parts of constituent (1) and 40–90 parts of constituent (2), by weight, are present in the photopolymerizable layer.

References Cited in the file of this patent

UNITED STATES PATENTS

| | | |
|---|---|---|
| 2,684,305 | Quinlivan | July 20, 1954 |
| 2,927,022 | Martin et al. | Mar. 1, 1960 |
| 2,964,401 | Plambeck | Dec. 13, 1960 |
| 2,993,789 | Crawford | July 25, 1961 |